United States Patent
Doering et al.

(10) Patent No.: US 11,401,157 B2
(45) Date of Patent: Aug. 2, 2022

(54) MICROMECHANICAL SENSOR DEVICE WITH IMPROVED LIQUID TIGHTNESS PROTECTION

(71) Applicant: Robert Bosch GmbH, Stuttgart (DE)

(72) Inventors: Christian Doering, Stuttgart (DE); Christoph Schelling, Stuttgart (DE); Franziska Rohlfing, Leonberg (DE); Johannes Kenntner, Magstadt (DE); Thomas Friedrich, Moessingen-Oeschingen (DE); Timo Lindemann, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 343 days.

(21) Appl. No.: 16/733,891

(22) PCT Filed: Jun. 27, 2018

(86) PCT No.: PCT/EP2018/067216
§ 371 (c)(1),
(2) Date: Apr. 1, 2020

(87) PCT Pub. No.: WO2019/007772
PCT Pub. Date: Jan. 10, 2019

(65) Prior Publication Data
US 2020/0255285 A1    Aug. 13, 2020

(30) Foreign Application Priority Data
Jul. 5, 2017 (DE) .......................... 102017211451.7

(51) Int. Cl.
*G01L 19/00* (2006.01)
*B81B 7/00* (2006.01)
(Continued)

(52) U.S. Cl.
CPC ........ *B81B 7/0038* (2013.01); *B81C 1/00285* (2013.01); *G01L 19/0038* (2013.01);
(Continued)

(58) Field of Classification Search
None
See application file for complete search history.

(56) References Cited

U.S. PATENT DOCUMENTS

2014/0061892 A1* 3/2014 Ziglioli ............ H04R 1/086
438/126
2014/0270623 A1* 9/2014 Ahmed ............ G01L 11/025
385/12
(Continued)

FOREIGN PATENT DOCUMENTS

CN  103604538 A  2/2014
CN  104843631 A  8/2015
(Continued)

OTHER PUBLICATIONS

International Search Report for PCT/EP2018/067216, dated Sep. 5, 2018.

*Primary Examiner* — Brandi N Hopkins
*Assistant Examiner* — Nigel H Plumb
(74) *Attorney, Agent, or Firm* — Norton Rose Fulbright US LLP; Gerard Messina

(57) ABSTRACT

A micromechanical sensor device and a corresponding production method, in which the micromechanical sensor device is equipped with a sensor substrate having a front side and a rear side, a sensor region provided on the front side that can be brought into contact with an environmental medium, and a capping device, attached on the front side, for capping the sensor region. In the capping device and/or in the sensor substrate, one or more capillaries are formed for conducting the environmental medium onto the sensor
(Continued)

region, a liquid-repellent layer being provided at least in some regions on the inner walls of the capillaries.

12 Claims, 4 Drawing Sheets

(51) Int. Cl.
    *B81C 1/00*          (2006.01)
    *G01L 19/06*       (2006.01)

(52) U.S. Cl.
    CPC .. *G01L 19/0654* (2013.01); *B81B 2201/0214* (2013.01); *B81B 2201/0264* (2013.01)

(56) References Cited

U.S. PATENT DOCUMENTS

| | | | |
|---|---|---|---|
| 2016/0287101 A1 * | 10/2016 | Tai | A61B 5/03 |
| 2016/0313769 A1 * | 10/2016 | Yoshitani | G09G 3/3611 |
| 2016/3137691 | 10/2016 | Yusuke | |

FOREIGN PATENT DOCUMENTS

| | | |
|---|---|---|
| CN | 104969049 A | 10/2015 |
| DE | 102005038754 A1 | 2/2007 |
| DE | 102009024048 B3 | 8/2010 |
| DE | 102013213065 | 1/2015 |
| DE | 10 2014 214 532 B3 | 10/2015 |
| WO | 2006/020093 A2 | 2/2006 |
| WO | 2016049221 A1 | 3/2016 |
| WO | 2017105851 | 6/2017 |

\* cited by examiner

MICROMECHANICAL SENSOR DEVICE WITH IMPROVED LIQUID TIGHTNESS PROTECTION

FIELD OF THE INVENTION

The present invention relates to a micromechanical sensor device and to a corresponding production method.

BACKGROUND INFORMATION

Although applicable to any micromechanical components, the present invention and the problem on which it is based are explained on the basis of micromechanical components having pressure sensors.

Patent document DE 10 2014 214 532 B3 discusses a component having a micromechanical component and a capping structure having a media connection opening. The capping structure has a sensor region having a membrane region that is for example a part of a pressure sensor that can be loaded with pressure through the media connection opening.

Patent document WO 2006/020093 A2 discusses a microfluidic control valve having an electroactive polymer to which voltage can be applied via electrodes in order to open and close a fluid passageway.

Micromechanical environmental sensors, such as gas sensors, pressure sensors, microphones, etc., require access to the media that are to be measured. In contrast to micromechanical sensors for measuring magnetic fields, acceleration, rotational rates, and the like, which can be packaged in a closed housing, the housing of environmental sensors always has to have an opening to the surrounding environment. Via this access, as long as it is not provided with a membrane that is liquid-tight but permeable to gas, liquids can also reach the sensor, which liquids may influence the functionality of the sensor or, in the worst case, destroy the sensor.

In the area of consumer electronics, in particular wearables (e.g. multifunction watches), there is a need for sensors that are watertight, so that the devices in which they are used are also watertight. Here, water cannot be permitted to enter into the device through the sensor region, and the sensor region itself is not to be damaged by the penetration of water. In addition to watertightness, tightness against other media, e.g. beverages or oils, may also be desirable. The requirement of protecting the sensor from the influence of contact with liquids also holds in particular for use in automotive applications.

Micromechanical environmental sensors are standardly installed in so-called cover-based housings. This means that the chips that have the sensor with the sensor membrane and the evaluation electronics in the form of an ASIC are attached on a substrate, e.g. a leadframe or a circuit board, by gluing or the like. Their contacting with one another and/or with the substrate is produced by wire bonds or through-holes. Subsequently, a capping structure, or cover structure, is glued onto the substrate in order to protect the environmental sensor, or the ASIC, from damage. Standardly, there is an opening in the capping structure so that environmental parameters such as air pressure, $H_2$ concentration, air humidity, etc., can be acquired by the sensor region of the environmental sensor.

In such a configuration, standardly no protection is ensured against penetration of water into the sensor region, so that it is not possible to install such environmental sensors in smartphones or wearables or the like that have to be watertight.

Watertight pressure sensors are realized having a special cover shape having a chimney, but require a large amount of constructive space. A seal provided around the chimney has to be applied, which is complicated. Such sensors are covered with gel, and as a result in particular the offset or the sensitivity can undergo a change via changes in temperature or lifespan. In addition, the substrate in such sensors is connected mechanically to the housing via the chimney, and as a result external stress influences (e.g. handling, temperature, etc.) can directly affect the sensor.

SUMMARY OF THE INVENTION

The present invention provides a micromechanical sensor device as described herein and a corresponding production method as described herein.

Further developments are the subject matter of the respective further descriptions herein.

The present invention makes it possible to provide a constructively small and watertight sensor package. For its production, wafer-level processes are used for packaging, and the necessary sealing structures are integrated directly in the sensor package in the form of a hydrophobic coating.

An aspect of the present invention is a media access to the actual sensor region, realized by one or more capillaries in the capping, for example a silicon wafer. On the other hand, the media access can also be part of the sensor substrate. Due to the fact that the surface of the capillaries is hydrophobic, given a suitable configuration, water can be prevented from penetrating into the capillaries and thus from reaching the sensor region.

In contrast to other solutions, in which a textile membrane (e.g. Gore-Tex®) or a gel layer is used as protection, according to the present invention the protected media access is achieved through semiconductor processes and thin-layer technology, whereby a lower-cost production process can be realized.

In addition to the advantages named above with regard to liquid-tightness, the configuration according to the present invention also provides protection against dust particles that are larger than the capillaries used. Through a redundant configuration of the media access, i.e. the use of a large number of capillaries, a possible clogging when used in an environment containing dust is counteracted.

The protective function according to the present invention is based on the capillary depression effect that occurs in capillaries. A liquid that does not wet the surface of the capillary is expelled from the capillary, and this effect is stronger the narrower the capillary is and the greater the angle of contact between the liquid and the surface is.

For example, in a capillary having a radius on the order of 7 μm and a surface that forms an angle of contact of 115° to the liquid, for example water, the liquid is theoretically expelled over 1 m. Conversely, this means that when the capillary is immersed in water up to a depth of 1 m, no water can penetrate into the capillary. The hydrostatic pressure does not overcome the capillary pressure, so that the water can penetrate into the capillary, until the immersion is deeper than this. In MEMS technology, capillaries having diameters of a few micrometers and lengths of a few 100 μm, up to an aspect ratio of 50:1, are realized for example in silicon wafers. In a deposition process, e.g. ALD (Atomic Layer Deposition) or CVD (Chemical Vapor Deposition), or using plasma processes, in particular layers containing fluorine, having hydrophobic surface properties, can be deposited on the surfaces of the substrate, or of the capping and the capillaries.

In order for example to achieve watertightness, a hydrophobic layer must be deposited, because the natural oxide that forms for example on silicon has the effect that the exposed surface is at first hydrophilic. As an alternative to a pure coating, in addition a surface structure can also be provided so that a contact angle of more than 120° in the case of water is achieved. This effect is known as the lotus effect. The surface structure required for this can be realized in MEMS technology, for example using suitable etching processes. Due to the significantly greater edge angle, in this way, a higher capillary pressure can be reached with the same capillary radius, and thus the effect is possible up to larger depths in comparison without surface structure.

According to a further development, the liquid-repellent layer is also provided on the outer side, facing away from the sensor substrate, of the capping device. This increases the liquid-tightness.

According to a further development, the liquid-repellent layer has a first layer region on the outer side, facing away from the sensor substrate, of the capping device, and has a second layer region on the inner walls of the capillaries, which are made of different materials. This offers advantages with regard to the process.

According to a further development, a cavern is provided in the capping device above the sensor region. This enables a uniform distribution of the medium to be acquired, in particular gas, over the sensor region.

According to a further development, the liquid-repellent layer is also provided on the cavern inner wall and on the sensor region. This offers advantages for particularly sensitive sensors.

According to a further development, the capillaries are formed above the sensor region. In this way, a larger region having capillaries can be realized.

According to a further development, the capillaries are formed laterally from the sensor region. This offers still greater protection against liquid, because the capillary is protected from liquid entering vertically.

According to a further development, the capping device has a closed bearer substrate having a first cavern, provided above the sensor region, in the capping device, the sensor substrate having a second cavern under the sensor region, into which the environmental medium can be conducted from the rear side via the capillaries, and through-holes being provided laterally at a distance from the sensor region that fluidically connect the first cavern and the second cavern.

According to a further development, the inner walls have a surface structuring. This increases the liquid-tightness.

According to a further development, the liquid-repellent layer is a water-repellent layer made of a fluorine-carbon compound, in particular a Teflon-like layer. Such a layer is very effective against the penetration of water, and can be produced easily and made very thin.

Further features and advantages of the present invention are explained in the following on the basis of specific embodiments, with reference to the Figures.

In the Figures, identical reference characters designate identical or functionally identical elements.

DETAILED DESCRIPTION

Figure 1A:
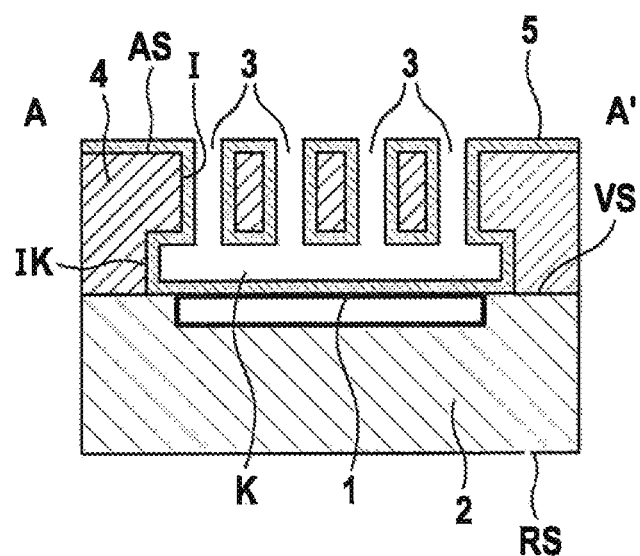
FIGS. 1a) and 1b) show schematic representations for the explanation of a micromechanical sensor device according to a first specific embodiment of the present invention, FIG. 1a) in cross-section (line A-A') and FIG. 1b) in a top view.
Figure 1B:
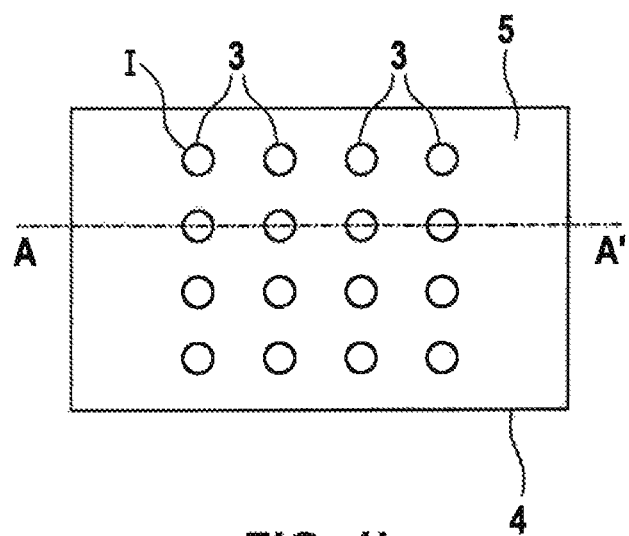

FIG. 1a),b) are schematic representations for the explanation of a micromechanical sensor device according to a first specific embodiment of the present invention, FIG. 1a) in cross-section (line A-A') and FIG. 1b) in a top view.

In FIGS. 1a),1b), reference character 2 designates a sensor substrate having a front side VS and a rear side RS, for example a silicon substrate. On front side VS of sensor substrate 2, there is formed a sensor region 1, for example a pressure sensor region having a membrane and a cavern situated under it, or a gas sensor region having a gas adsorption layer and a heating device. A capping device 4, for example a silicon capping substrate, is bonded onto the front side VS of the sensor substrate.

In capping device 4, a plurality of capillaries 3 are formed for conducting an environmental medium, in the present example a gas, to sensor region 1. Above sensor region 1 there is a cavern K in capping device 4, which distributes the environmental medium uniformly over sensor region 1. On outer side AS, facing away from sensor substrate 2, of capping device 4, on inner walls I of capillaries 3, on cavern inner wall IK, and above sensor region 1, there is formed a liquid-repellent layer 5, having for example a fluorine-carbon compound ($C_xF_y$), in particular a Teflon-type compound.

Liquid-repellent layer 5 enables gas access to sensor region 1, but, given suitable dimensioning of capillaries 3, prevents water from passing through onto sensor region 1. The layer thickness of the water-repellent layer is typically from 5 nm (nanometers) to 10 μm (micrometers). Liquid-repellent layer 5 can be formed for example after the formation of capillaries 3 through a deposition process, for example a plasma process, a CVD process, or an ALD process, etc.

The depicted number of sixteen capillaries 3 coated with liquid-repellent layer 5 is presented only as an example, and can be varied depending on the application.

Figure 2A:
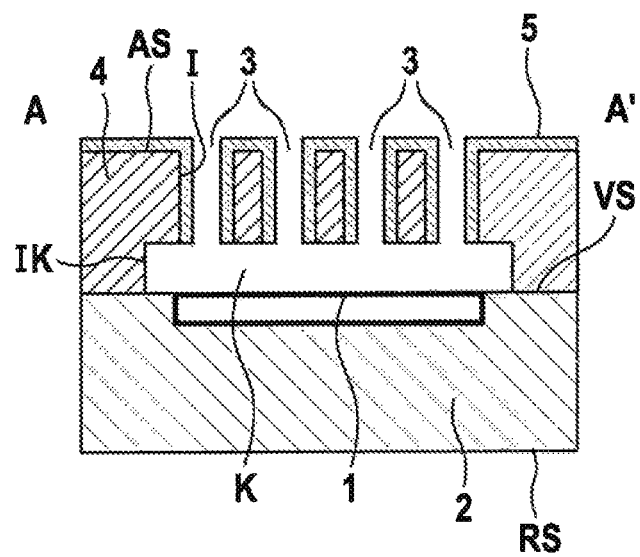
FIGS. 2a) and 2b) show schematic representations for the explanation of a micromechanical sensor device according to a second specific embodiment of the present invention, FIG. 2a) in cross-section (line A-A') and FIG. 2b) in a top view.
Figure 2B:
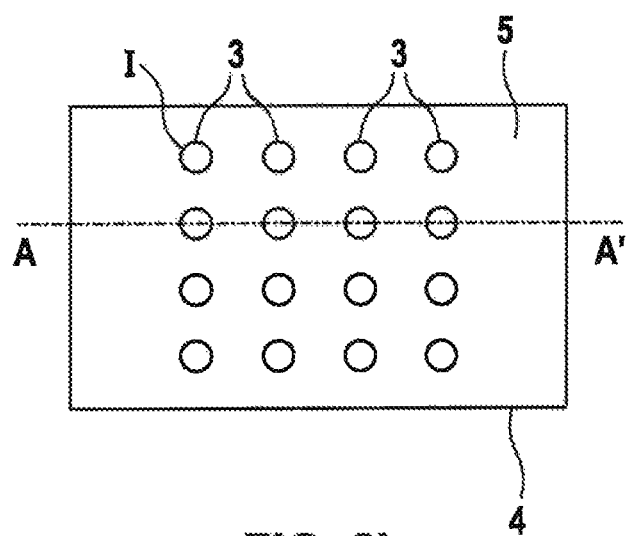

FIG. 2a),b) are schematic representations for the explanation of a micromechanical sensor device according to a second specific embodiment of the present invention, FIG. 2a) in cross-section (line A-A') and FIG. 2b) in a top view.

In the second exemplary embodiment according to FIGS. 2a),2b), only outer side AS of capping device 4, and inner walls I of capillaries 3, are coated with liquid-repellent layer 5. This can be advantageous in particular for gas sensors whose gas-sensitive sensor region 1 must not be covered.

In other respects, the second specific embodiment is constructed in the same manner as the first specific embodiment.

Figure 3:
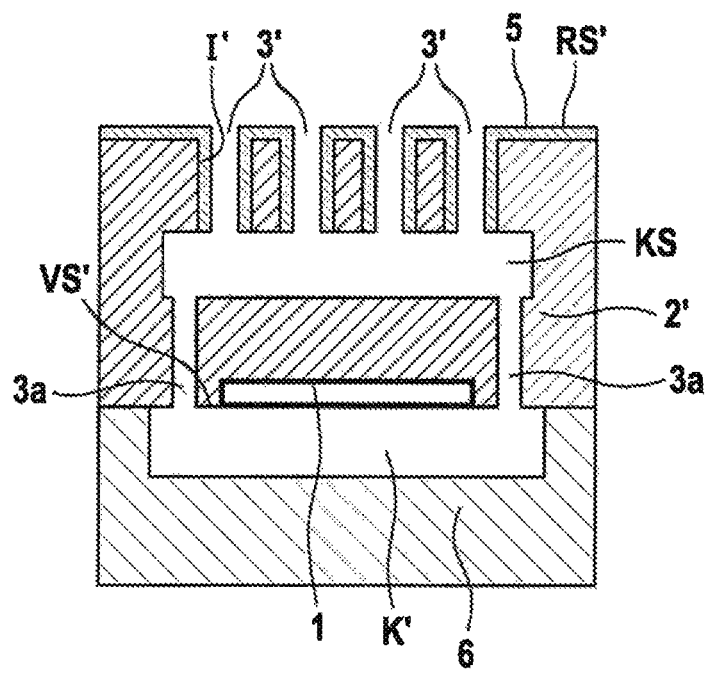
FIG. 3 shows a schematic cross-sectional representation for the explanation of a micromechanical sensor device according to a third specific embodiment of the present invention.

FIG. 3 is a schematic cross-sectional representation for the explanation of a micromechanical sensor device according to a third specific embodiment of the present invention.

In the third specific embodiment, the sensor substrate is designated by reference character 2', and has a front side VS' and a rear side RS'. In this specific embodiment, capping device 6 is a bearer substrate having a first cavern K' provided above sensor region 1. Here, bearer substrate 6 has no capillaries.

Sensor substrate 2' has, in its interior, a second cavern KS below sensor region 1, into which cavern the environmental medium, for example a gas, can be conducted from rear side RS' via capillaries 3'. In the third specific embodiment, rear side RS' and inner walls I' of the capillaries are coated with the liquid-repellent layer 5, whereby, together with the geometry of capillaries 3', the liquid-repellent effect as in the specific embodiments described above can be achieved. It is also possible for all the surfaces to be coated with a hydrophobic layer.

Laterally at a distance from sensor region 1, through-holes 3a are provided that fluidically connect first cavern K' and second cavern KS, so that the environmental medium can be conducted onto sensor region 1.

Figure 4:
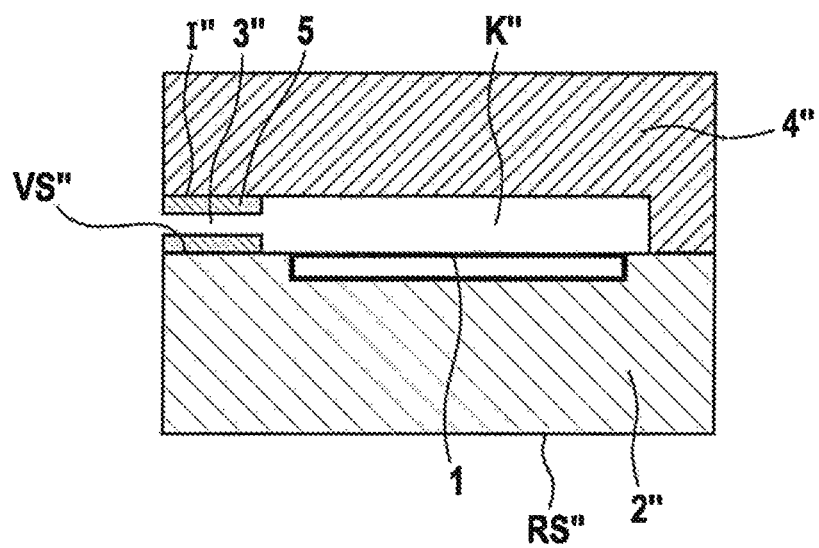
FIG. 4 shows a schematic cross-sectional representation for the explanation of a micromechanical sensor device according to a fourth specific embodiment of the present invention.

FIG. 4 is a schematic cross-sectional representation for the explanation of a micromechanical sensor device according to a fourth specific embodiment of the present invention.

In the fourth specific embodiment, the sensor substrate is designated by reference character 2" and has a front side VS" and a rear side RS". Here as well, capping device 4" is a capping wafer having a cavern K" provided above sensor region 1. In this fourth specific embodiment, the access of the environmental medium to the sensor region takes place through a capillary 3" that is formed laterally from sensor region 1 in capping device 4". Inner wall I" of capillary 3" is coated with liquid-repellent layer 5. Likewise, the entire inner surface (capillary and cavern) can also be coated (not shown).

In other respects, the fourth specific embodiment is constructed in the same manner as the first specific embodiment.

Figure 5A:
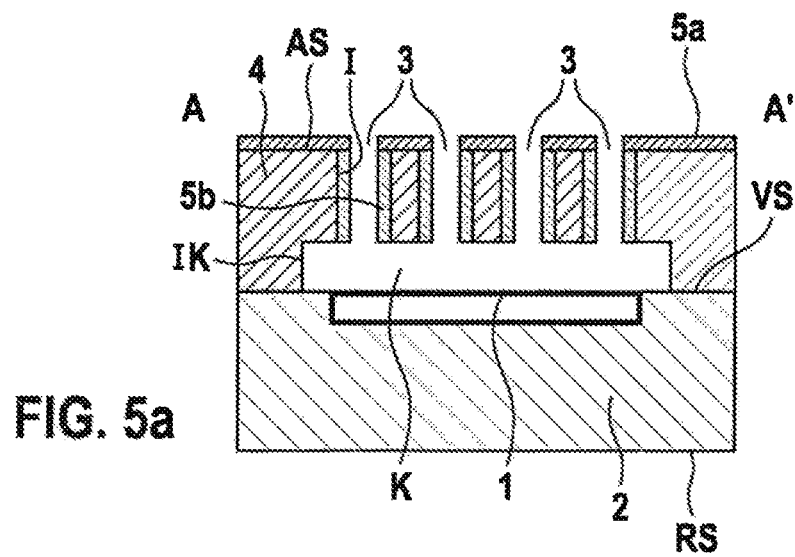
FIGS. 5a) and 5b) show schematic representations for the explanation of a micromechanical sensor device according to a fifth specific embodiment of the present invention, FIG. 5a) in cross-section (line A-A') and FIG. 5b) in a top view.
Figure 5B:
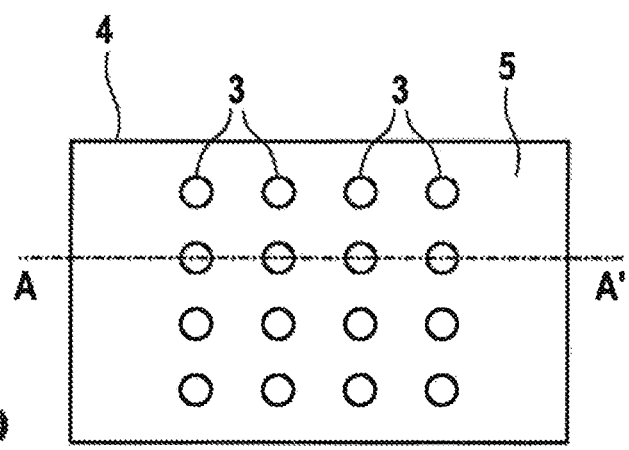

FIG. 5a),b) are schematic representations for the explanation of a micromechanical sensor device according to a fifth specific embodiment of the present invention, FIG. 5a) in cross-section (line A-A') and FIG. 5b) in a top view.

The fifth specific embodiment shown in FIGS. 5a), 5b) is constructed analogously to the second specific embodiment described above, the liquid-repellent layer 5a, 5b having a first layer region 5a on the outer side AS, facing away from sensor substrate 2, of capping device 4, and having a second layer region 5b on inner walls I of capillaries 3, which are made of different materials. This can also be appropriate from the point of view of the process.

Figure 6:
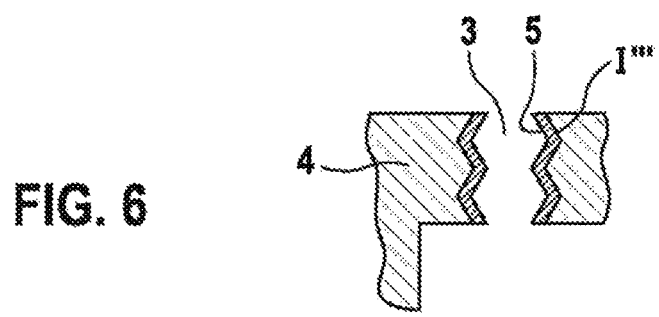
FIG. 6 shows a detailed schematic cross-sectional representation of a capillary for the explanation of a micromechanical sensor device according to a sixth specific embodiment of the present invention.

FIG. 6 is a detailed schematic cross-sectional representation of a capillary for the explanation of a micromechanical sensor device according to a sixth specific embodiment of the present invention.

In the sixth specific embodiment according to FIG. 6, which corresponds substantially to the first specific embodiment, liquid-repellent layer 5 is formed only on inner wall I''' of capillary 3. In addition, inner wall I''' has a surface structuring, here indicated schematically by a zigzag shape, that additionally supports the liquid-repellent effect.

Although the present invention has been described on the basis of the exemplary embodiments, it is not limited thereto. In particular, the named materials and topologies are presented only as examples, and are not limited to the explained examples.

Particular further applications for the micromechanical sensor device according to the present invention are for example chemical gas sensors, such as metal oxide gas sensors, thermal conductivity sensors, Pirani elements, mass flow sensors, such as air mass meters, lambda probes on a micromechanical membrane, infrared sensor devices, etc.

What is claimed is:

1. A micromechanical sensor device, comprising:
   a sensor substrate having a front side and a rear side;
   a sensor region, on the front side, that can be brought into contact with an environmental medium; and
   a capping device, attached on the front side, for capping the sensor region;
   wherein one or more capillaries for conducting the environmental medium onto the sensor region are formed in the capping device and/or in the sensor substrate, and
   wherein there is a liquid-repellent layer on at least some regions on the inner walls of the capillaries,
   wherein the liquid-repellent layer is on the outer side, facing away from the sensor substrate, of the capping device.

2. The micromechanical sensor device of claim 1, wherein there is a cavern in the capping device above the sensor region.

3. The micromechanical sensor device of claim 1, wherein the capillaries are formed above the sensor region.

4. The micromechanical sensor device of claim 1, wherein the capillaries are formed laterally from the sensor region.

5. The micromechanical sensor device of claim 1, wherein the capping device includes a closed bearer substrate having a first cavern, provided above the sensor region in the capping device, wherein the sensor substrate has a second cavern below the sensor region into which the environmental medium can be conducted from the rear side via the capillaries, and wherein there are through-holes provided laterally at a distance from the sensor region that fluidically connect the first cavern and the second cavern.

6. The micromechanical sensor device of claim 1, wherein the inner walls have a surface structuring.

7. The micromechanical sensor device of claim 1, wherein the liquid-repellent layer includes a water-repellent layer made of a fluorine-carbon compound.

8. The micromechanical sensor device of claim 1, wherein the liquid-repellent layer includes a water-repellent layer made of a fluorine-carbon compound, in particular a Teflon-like layer.

9. A micromechanical sensor device, comprising:
   a sensor substrate having a front side and a rear side;
   a sensor region, on the front side, that can be brought into contact with an environmental medium; and
   a capping device, attached on the front side, for capping the sensor region;
   wherein one or more capillaries for conducting the environmental medium onto the sensor region are formed in the capping device and/or in the sensor substrate, and
   wherein there is a liquid-repellent layer on at least some regions on the inner walls of the capillaries,
   wherein the liquid-repellent layer is on the outer side, facing away from the sensor substrate, of the capping device, wherein the liquid-repellent layer has a first layer region on the outer side, facing away from the sensor substrate, of the capping device, and has a second layer region on the inner walls of the capillaries, which are made of different materials.

10. A micromechanical sensor device, comprising:
a sensor substrate having a front side and a rear side;
a sensor region, on the front side, that can be brought into contact with an environmental medium; and
a capping device, attached on the front side, for capping the sensor region;
wherein one or more capillaries for conducting the environmental medium onto the sensor region are formed in the capping device and/or in the sensor substrate, and
wherein there is a liquid-repellent layer on at least some regions on the inner walls of the capillaries,
wherein there is a cavern in the capping device above the sensor region,
wherein the liquid-repellent layer is also on the cavern inner wall and on the sensor region.

11. A method for producing a micromechanical sensor device, the method comprising:
providing a sensor substrate, having a front side and a rear side, that has on its front side a sensor region that can be brought into contact with an environmental medium; and
attaching a capping device on the front side for capping the sensor region;
forming one or more capillaries for conducting the environmental medium onto the sensor region in the capping device and/or in the sensor substrate; and
providing a liquid-repellent layer on at least some regions on the inner walls of the capillaries,
wherein the liquid-repellent layer is on the outer side, facing away from the sensor substrate, of the capping device.

12. The method of claim 11, wherein the liquid-repellent layer is formed by a deposition process and has a thickness of from 5 nanometers to 10 micrometers.

* * * * *